United States Patent
Ito et al.

(10) Patent No.: US 10,693,096 B2
(45) Date of Patent: Jun. 23, 2020

(54) EL ELEMENT AND METHOD FOR MANUFACTURING EL ELEMENT WITH A LIGHT-EMITTING LAYER INCLUDING AN IONIC LIQUID, A PHOSPHORESCENT MATERIAL, AND A FLUORESCENT MATERIAL

(71) Applicant: Sharp Kabushiki Kaisha, Sakai, Osaka (JP)

(72) Inventors: Asae Ito, Sakai (JP); Manabu Niboshi, Sakai (JP); Yuto Tsukamoto, Sakai (JP); Shinichi Kawato, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 63 days.

(21) Appl. No.: 16/082,995

(22) PCT Filed: Mar. 16, 2017

(86) PCT No.: PCT/JP2017/010704
§ 371 (c)(1),
(2) Date: Sep. 7, 2018

(87) PCT Pub. No.: WO2017/159797
PCT Pub. Date: Sep. 21, 2017

(65) Prior Publication Data
US 2019/0081268 A1    Mar. 14, 2019

(30) Foreign Application Priority Data
Mar. 18, 2016   (JP) .................. 2016-056091

(51) Int. Cl.
*H01L 51/50*    (2006.01)
*H01L 51/52*    (2006.01)
(Continued)

(52) U.S. Cl.
CPC ........ *H01L 51/5016* (2013.01); *H01L 27/322* (2013.01); *H01L 27/3246* (2013.01);
(Continued)

(58) Field of Classification Search
CPC ............. H01L 51/5016; H01L 51/5221; H01L 51/5206; H01L 51/5088; H01L 51/001;
(Continued)

(56) References Cited

U.S. PATENT DOCUMENTS

2008/0303415 A1    12/2008    Suzuri et al.
2009/0290211 A1    11/2009    Miteva et al.
(Continued)

FOREIGN PATENT DOCUMENTS

JP    2015-507651 A    3/2015
WO    2006/013738 A1    2/2006
(Continued)

OTHER PUBLICATIONS

Hisamitsu et al., Photon-Upconverting Ionic Liquids: Effective Triplet Energy Migration in Contiguous Ionic Chromophore, Angewandte Chemie International Edition, 2015,54, pp. 11550-11554. (Year: 2015).*
(Continued)

*Primary Examiner* — Tracie Y Green
(74) *Attorney, Agent, or Firm* — Keating & Bennett, LLP

(57) ABSTRACT

Provided is an EL element utilizing upconversion light emission involving highly efficient triplet-triplet annihilation. A blue-light-emitting layer includes an ionic liquid, a red phosphorescent material, and a blue fluorescent material. The blue fluorescent material and the red phosphorescent material are homogeneously dispersed in a liquid film of the ionic liquid.

14 Claims, 6 Drawing Sheets

(51) Int. Cl.
*H01L 27/32* (2006.01)
*H01L 51/00* (2006.01)

(52) U.S. Cl.
CPC ........ *H01L 51/001* (2013.01); *H01L 51/5032* (2013.01); *H01L 51/5044* (2013.01); *H01L 51/5088* (2013.01); *H01L 51/5206* (2013.01); *H01L 51/5221* (2013.01); *H01L 2251/5376* (2013.01)

(58) Field of Classification Search
CPC ............... H01L 27/3246; H01L 27/322; H01L 2251/5376
See application file for complete search history.

(56) References Cited

U.S. PATENT DOCUMENTS

| | | |
|---|---|---|
| 2011/0304263 A1 | 12/2011 | Xia et al. |
| 2013/0274090 A1 | 10/2013 | Murakami et al. |
| 2014/0183480 A1* | 7/2014 | Lee ................... H01L 51/5265 257/40 |
| 2014/0358198 A1 | 12/2014 | Buchholz et al. |
| 2016/0329512 A1 | 11/2016 | Nishide et al. |
| 2016/0372525 A1* | 12/2016 | Yan ......................... H01L 51/56 |
| 2017/0250363 A1* | 8/2017 | Baumann ............... H01L 51/009 |
| 2018/0291264 A1* | 10/2018 | Lee ........................ C09K 11/06 |

FOREIGN PATENT DOCUMENTS

| | | |
|---|---|---|
| WO | 2012/050137 A1 | 4/2012 |
| WO | 2014/157619 A1 | 10/2014 |

OTHER PUBLICATIONS

Official Communication issued in International Patent Application No. PCT/JP2017/010704, dated May 30, 2017.

Murakami, "Photochemical photon upconverters with ionic liquids", Chemical Physics Letters 516, 2011, pp. 56-61.

Hisamitsu et al., "Photon-Upconverting Ionic Liquids: Effective Triplet Energy Migration in Contiguous Ionic Chromophore Arrays", Angewandte Chemie International Edition, 2015, 54, 7 pages.

Maruyama et al., "Molecular Beam Deposition of Nanoscale Ionic Liquids in Ultrahigh Vacuum", ACS NANO, vol. 4, No. 10, 2010, pp. 5946-5952.

* cited by examiner

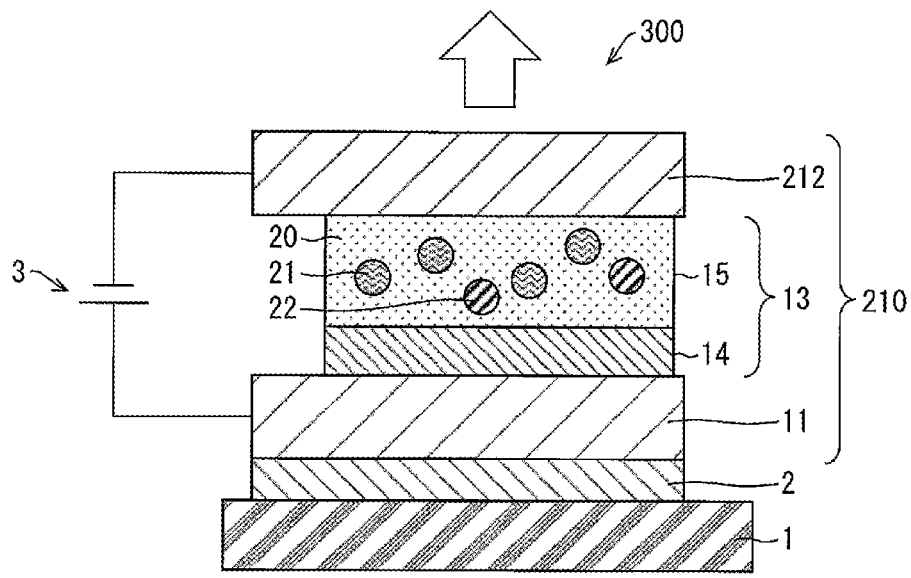
FIG. 5
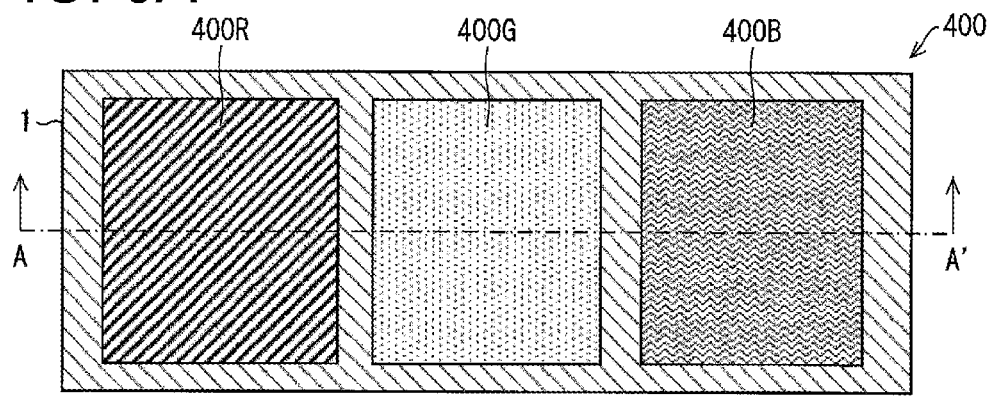
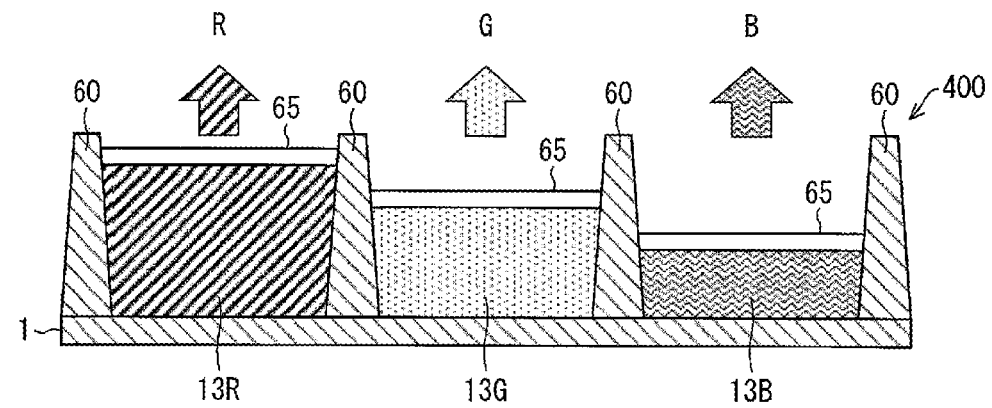

EL ELEMENT AND METHOD FOR MANUFACTURING EL ELEMENT WITH A LIGHT-EMITTING LAYER INCLUDING AN IONIC LIQUID, A PHOSPHORESCENT MATERIAL, AND A FLUORESCENT MATERIAL

TECHNICAL FIELD

The disclosure relates to an EL element and a method for manufacturing the EL element.

BACKGROUND ART

In recent years, highly efficient mechanisms for light emission utilizing photon upconversion, particularly upconversion involving triplet-triplet annihilation (TTA: T-T Annihilation), (TTA-UC), have been attracting attention. Photon upconversion is for converting low-energy light, such as near-infrared light, to high-energy light, such as visible light.

The mechanism for light emission enables excitation of all light-emitting centers, for red, blue, and green, by using a photosensitizer and further, particularly for emission of blue light, enables realization of emission of shorter wavelength light, and hence, the mechanism is expected to be applied to, for example, organic EL displays (PTL 1).

TTA occurs when triplet excitons collide with each other, and thus it is necessary to produce overlaps of the wave functions between acceptor molecules and it is desirable that the distance between acceptor molecules be from 0 nm to 1 nm. Thus, in the field of study of upconversion utilizing TTA, a prevalent method is one in which donors and acceptors are mixed together in a volatile organic solvent to cause energy transfer by utilizing the diffusion of donors and acceptors in the solution. Thus, it is not easy to apply upconversion utilizing TTA to devices such as solar cells and organic EL displays.

On the other hand, there are examples in which donors and acceptors are dispersed in a polymer such as polymethylmethacrylate (PMMA). However, in a polymer, molecules cannot easily diffuse and collide and thus it is difficult to achieve high efficiency.

Recently, further examples have been reported. In one example, donors are dispersed in molecularly assembled acceptors to achieve very highly efficient (quantum efficiency of 30%) light emission in a solution. In another example, highly efficient TTA-UC in a solid is successfully performed by synthesizing nanocrystals of metal organic frameworks (MOF: Metal Organic Frameworks) by using acceptor molecules as building blocks and coating the surface of the crystals with donor molecules. The techniques described above, however, cannot be accomplished by an in-situ vacuum vapor deposition process and thus, because of the limitations on the process, are difficult to apply to EL elements that are produced by layering organic films in a vacuum.

Additionally, PTL 2 discloses a visually homogeneous and transparent light conversion element, wherein organic photosensitizing molecules and organic light-emitting molecules, which are a combination that exhibits a triplet-triplet annihilation process, are dissolved and/or dispersed in an ionic liquid. The light conversion element of PTL 2 is obtained through a process that includes adding a solution in which organic photosensitizing molecules are dissolved in toluene and a solution in which organic light-emitting molecules are dissolved in toluene to an ionic liquid, performing stirring for homogenization, and thereafter removing the toluene.

The light conversion element of PTL 2 is able to convert input light into high-intensity light by using upconversion involving TTA and can be applied to, for example, solar cells, and the like.

CITATION LIST

Patent Literature

PTL 1: WO 2014/157619 (published Oct. 2, 2014)
PTL 2: WO 2012/050137 (published Apr. 19, 2012)

Non Patent Literature

NPL 1: Shingo Maruyama et al., Molecular Beam Deposition of Nanoscale Ionic Liquids in Ultrahigh Vacuum, ACS NANO, vol.4, No. 10, 2010.

SUMMARY

Technical Problem

Application of the technology of PTL 2 to EL elements, however, requires a wet process or a process for degassing the solvent. Thus, a process for forming the light-emitting layer by a wet process is to be added to the process for forming the negative electrode by vacuum vapor deposition, which poses a drawback in that the number of manufacturing processes increases. Additionally, in the case that a process for degassing is performed, the number of processes also increases, and thus mass production is difficult.

Furthermore, since the light conversion element of PTL 2 is liquid, it is difficult to form the light conversion element to have a film thickness desirable for the light-emitting layer of an EL element.

NPL 1 discloses a technology for forming an ionic liquid thin film by vapor deposition without decomposing the ionic liquid, by irradiating, with a continuous wave infrared laser, a target containing an ionic liquid and a Si powder mixed therewith.

PTL 2, however, discloses no method for mixing a phosphorescent material serving as the donor and a fluorescent material serving as the acceptor with the formed ionic liquid film and thus poses difficulties in manufacturing an EL element utilizing highly efficient TTA-UC, which is achieved by frequent collision between acceptors.

The disclosure has been made in view of the problems described above. An object of the disclosure is to provide an EL element utilizing upconversion light emission involving highly efficient triplet-triplet annihilation and to provide a method for manufacturing such an EL element.

Solution to Problem

In order to overcome the drawbacks described above, an EL element according to one aspect of the disclosure includes a first electrode, a second electrode, and at least one light-emitting layer provided between the first electrode and the second electrode. The light-emitting layer includes an ionic liquid, a phosphorescent material, and a fluorescent material. A lowest triplet excited state energy level of the phosphorescent material is higher than a lowest triplet excited state energy level of the fluorescent material, and a lowest singlet excited state energy level of the fluorescent material is higher than a lowest singlet excited state energy level of the phosphorescent material. The fluorescent material and the phosphorescent material are homogeneously dispersed in a liquid film of the ionic liquid.

Additionally, in order to overcome the drawbacks described above, a method for manufacturing an EL element according to another aspect of the disclosure is as follows. The EL element includes a first electrode, a second electrode, and at least one light-emitting layer provided between the first electrode and the second electrode. The light-emitting layer includes a phosphorescent material and a fluorescent material. A lowest triplet excited state energy level of the phosphorescent material is higher than a lowest triplet excited state energy level of the fluorescent material, and a lowest singlet excited state energy level of the fluorescent material is higher than a lowest singlet excited state energy level of the phosphorescent material. The method includes forming the light-emitting layer by codepositing an ionic liquid, the phosphorescent material, and the fluorescent material.

Advantageous Effects of Disclosure

Aspects of the disclosure provide EL elements utilizing upconversion light emission involving highly efficient triplet-triplet annihilation.

BRIEF DESCRIPTION OF DRAWINGS

FIG. 2A illustrates energy transfer between a phosphorescent material and a fluorescent material. FIG. 2B illustrates energy levels of the phosphorescent material and the fluorescent material.

FIG. 5 is a cross-sectional view of an EL light-emitting device according to a third embodiment of the disclosure.

FIGS. 6A and 6B illustrate a configuration of an EL light-emitting device according to a fourth embodiment of the disclosure. FIG. 6A is a plan view and FIG. 6B is a cross-sectional view along line A-A' of FIG. 6A, viewed in the direction of the arrow.

FIG. 7A is a plan view and FIG. 7B is a cross-sectional view along line B-B' of FIG. 7A, viewed in the direction of the arrow.

DESCRIPTION OF EMBODIMENTS

First Embodiment

Figure 1:
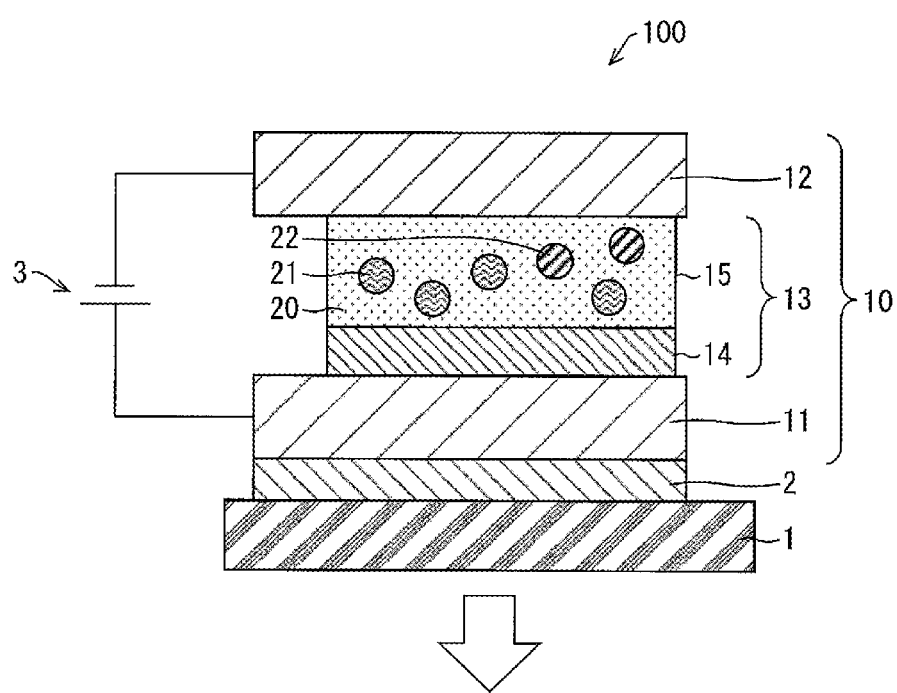
FIG. 1 is a cross-sectional view of an EL light-emitting device according to a first embodiment of the disclosure.

An embodiment of the disclosure will be described in detail below with reference to FIGS. 1 to 3.
Configuration of EL Light-Emitting Device FIG. 1 is a cross-sectional view of an EL light-emitting device according to the present embodiment.

An EL light-emitting device 100 has a configuration in which a transparent substrate 1, a reflective electrode 2, and an EL element 10 are provided in this order. Note that it is preferable that a sealing film (not illustrated) for sealing the EL element 10 between the substrate 1 and the sealing film be provided. The substrate 1 may be, for example, a glass substrate.

The EL element 10 has a configuration in which a first electrode 11, an EL layer 13, and a second electrode 12 are provided in this order from the reflective electrode 2-side. The first electrode 11 is a positive electrode, and the second electrode 12 is a negative electrode. The first electrode 11 and the second electrode 12 are provided to face each other, between which a voltage can be applied by a power source 3. The first electrode 11 is a transparent electrode or a semitransparent electrode. The first electrode 11 may be made from, for example, ITO of 100 nm thickness. The second electrode 12 may be made from, for example, aluminum (Al) or silver (Ag), of 100 nm thickness.

The EL layer 13 has a configuration in which a hole injection layer 14 and a blue-light-emitting layer 15 are provided in this order from the first electrode 11-side. Note that, although not illustrated, the EL layer 13 according to the present embodiment may have a configuration in which a hole transport layer is provided between the hole injection layer 14 and the blue-light-emitting layer 15, and an electron transport layer and an electron injection layer are provided in this order between the blue-light-emitting layer 15 and the second electrode 12.

When a voltage is applied between the first electrode 11 and the second electrode 12, positive holes are injected into the EL layer 13 from the first electrode 11, and electrons are injected into the EL layer 13 from the second electrode 12. When the positive holes and electrons combine with each other in the blue-light-emitting layer 15, the blue-light-emitting layer 15 emits light. The blue light produced in the blue-light-emitting layer 15 is extracted from the substrate 1-side. That is, the EL light-emitting device 100 is a bottom-emitting type light-emitting device.

The thickness of the blue-light-emitting layer 15 may be, for example, 40 nm. The hole injection layer 14 may be made from, for example, HAT-CN (dipyrazino[2,3-f:2',3'-h]quinoxaline-2,3,6,7,10,11-hexacarbonitrile) of 40 nm thickness.

Additionally, the hole injection layer 14 may be made from HAT-CN or instead may be a layer of OMox obtained by codepositing an organic material and molybdenum oxide or a layer of TAPC, α-NPD, TPD, CuPC, PEDOT/PSS, or the like.
Light-Emitting Layer As illustrated in FIG. 1, the blue-light-emitting layer 15 includes an ionic liquid 20, a blue fluorescent material 21 (fluorescent material, first fluorescent material), and a red phosphorescent material 22 (phosphorescent material).

Typically, the ionic liquid 20 has a viscosity of, approximately, from 1/10 to 1/100 the viscosity of a polymeric material and thus has a high flowability, which allows diffusion of molecules to occur readily, compared with a polymeric material. Thus, the blue fluorescent material 21 and the red phosphorescent material 22 are homogeneously dispersed in the liquid film of the ionic liquid 20.

Note that the viscosity of the ionic liquid 20 is not particularly limited but, since the upconversion light emission, described later, is due to the TTA process, it is appropriate that the ionic liquid 20 be in a liquid state in the temperature range in which the EL light-emitting device 100 is driven, for example, in a range from −100° C. to 200° C., from −50° C. to 100° C., from −30° C. to 80° C., or the like. The viscosity at 300K of the ionic liquid 20 of the EL element 10 according to one aspect of the disclosure may be 0.000001 Pa·S or greater, 0.00001 Pa·S or greater, or 0.0001

Pa·S or greater and may preferably be 1 Pa·S or less, 10 Pa·S or less, 100 Pa·S or less, or 1000 Pa·S or less.

Additionally, the melting point and the solidification temperature of the ionic liquid 20 are not particularly limited but, since the upconversion light emission is due to the TTA process, it is preferable that the melting point be, for example, from −200° C. to 10° C. in view of the environments in which the EL light-emitting device 100 is used. Additionally, the melting point of the ionic liquid 20 is preferably 0° C. or lower, more preferably −10° C. or lower, more preferably −30° C. or lower, and more preferably −50° C. or lower.

Additionally, it is preferable that the solidification temperature (freezing point) of the ionic liquid 20 be from −200° C. to 10° C. Additionally, the freezing point of the ionic liquid 20 is preferably 0° C. or lower, more preferably −10° C. or lower, more preferably −30° C. or lower, and more preferably −50° C. or lower.

Additionally, for use in a normal environment, it is appropriate that both the melting point and the freezing point be 0° C. or lower.

The lowest triplet excited state energy level of the red phosphorescent material 22 is higher than the lowest triplet excited state energy level of the blue fluorescent material 21. Additionally, the lowest singlet excited state energy level of the blue fluorescent material 21 is higher than the lowest singlet excited state energy level of the red phosphorescent material 22.

Thus, the red phosphorescent material 22 serves as a photosensitizer for the blue fluorescent material 21, and consequently, light in the blue wavelength range (or ultraviolet range), which is the fluorescence wavelength region of the blue fluorescent material 21, is extracted from the blue-light-emitting layer 15. That is, in the blue-light-emitting layer 15 of the present embodiment, the red phosphorescent material 22 is a donor and the blue fluorescent material 21 is an acceptor.

Examples of the above-mentioned materials are as follows. The ionic liquid 20 may be made from 1-butyl-3-methylimidazolium bis(trifluoromethanesulfonyl)imide ([Bmim][TFSA]). The blue fluorescent material 21 may be made from 9,10-diphenylanthracene (DPA). The red phosphorescent material 22 may be made from platinum octaethylporphyrin complex (PtOEP).

Mechanism for Light Emission

Figure 2A:
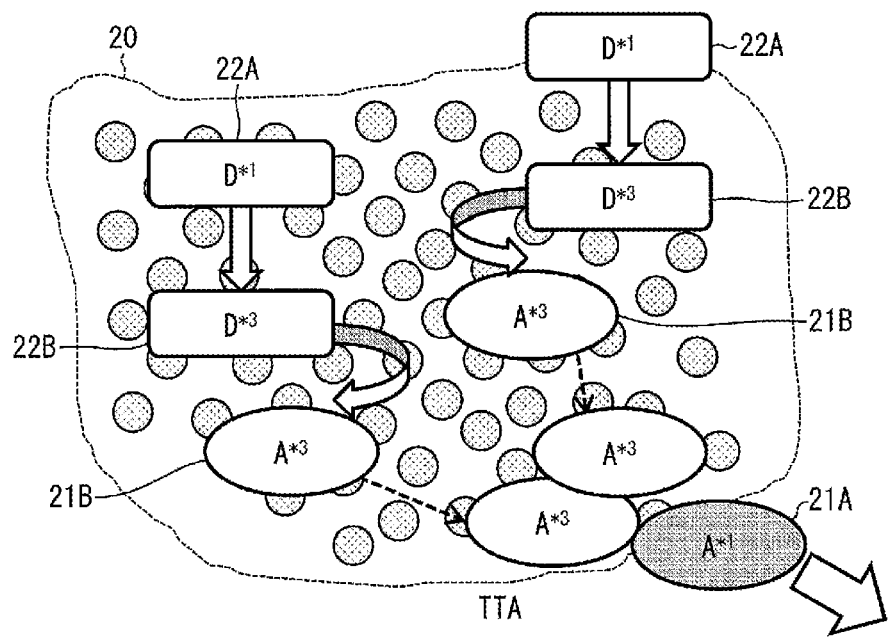
FIGS. 2A and 2B are schematic diagrams illustrating a mechanism for light emission of a light-emitting layer.
Figure 2B:
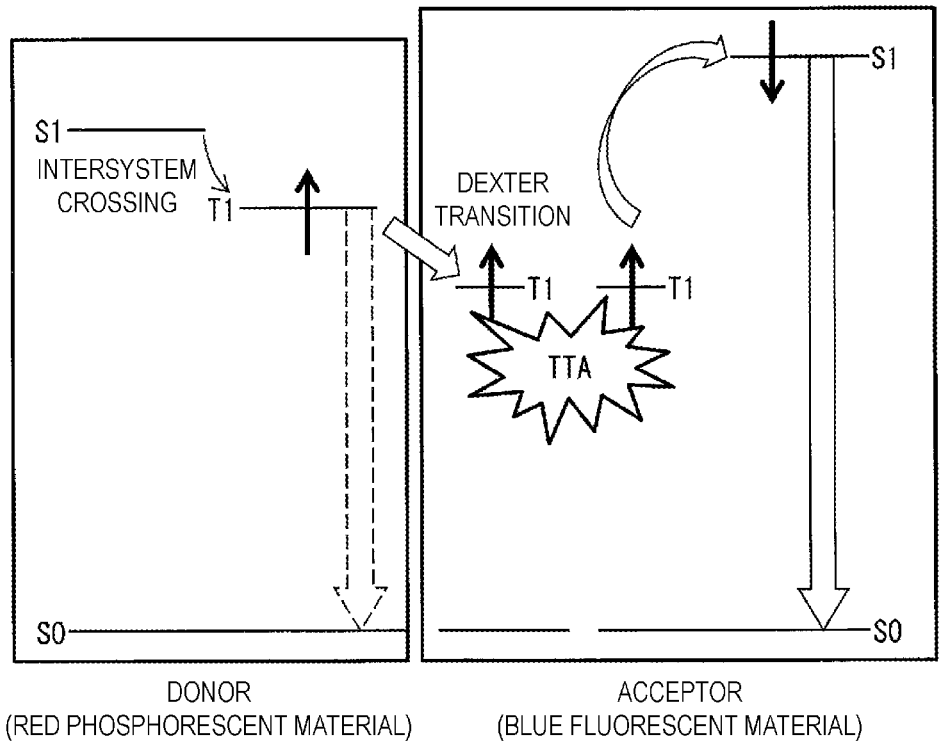

FIGS. 2A and 2B are schematic diagrams illustrating the mechanism for light emission of the light-emitting layer. FIG. 2A illustrates energy transfer between a phosphorescent material and a fluorescent material. FIG. 2B illustrates energy levels of the phosphorescent material and the fluorescent material. In FIG. 2B, the solid-line arrows indicate electron spin directions.

When positive holes and electrons are injected into the EL layer 13, the positive holes and electrons combine with each other in the blue-light-emitting layer 15 to produce energy, and thus, as illustrated in FIG. 2A, the red phosphorescent material 22 is excited to form a red phosphorescent material 22A, which is in a singlet excited state. Accordingly, as illustrated in FIG. 2B, the red phosphorescent material 22 changes from a ground state S0 to a singlet excited state S1, which is a high-energy state.

Further, the red phosphorescent material 22A in the singlet excited state S1 transits to a triplet excited state T1 via intersystem crossing to form a red phosphorescent material 22B, which is in the triplet excited state T1.

As illustrated in FIG. 2B, a lowest triplet excited state T1 energy level of the red phosphorescent material 22 is higher than a lowest triplet excited state T1 energy level of the blue fluorescent material 21. Accordingly, via Dexter mechanism (Dexter transfer), the red phosphorescent material 22B in the triplet excited state T1 exchanges energy with the blue fluorescent material 21, at adjacent portions, and thus returns to the ground state S0, whereas the blue fluorescent material 21 forms a blue fluorescent material 21B, which is in the triplet excited state T1.

Migration of excited states occurs between the blue fluorescent material 21B in the triplet excited state T1 and other portions of the blue fluorescent material 21. Eventually, portions of the blue fluorescent material 21B in the triplet excited state T1 collide with each other, and as a result, via Dexter mechanism, one of the portions of the blue fluorescent material 21B in the triplet excited state T1 forms a blue fluorescent material 21A, which is in a singlet excited state S1.

Here, a lowest singlet excited state S1 energy level of the blue fluorescent material 21 is higher than a lowest singlet excited state S1 energy level of the red phosphorescent material 22. Thus, the emission of blue light that occurs when the blue fluorescent material 21 returns to its ground state S0 is upconversion light emission.

In the EL light-emitting device 100 of the present embodiment, in the blue-light-emitting layer 15, the blue fluorescent material 21 and the red phosphorescent material 22 are homogeneously dispersed in the liquid film of the ionic liquid 20 having low-viscosity. This facilitates the occurrence of diffusion and collision of molecules that form the blue fluorescent material 21 and the red phosphorescent material 22, compared with the case in which the blue fluorescent material 21 and the red phosphorescent material 22 are included in a solid. Thus, TTA can be induced efficiently to achieve upconversion light emission, and consequently, light is emitted with high quantum efficiency.

Manufacturing Method

A method for forming (method for manufacturing) the EL element 10 will be described below.

In a manufacturing process of the EL light-emitting device 100 of the present embodiment, the EL element 10 is formed by vapor deposition in a vacuum. That is, the first electrode 11, the hole injection layer 14, the blue-light-emitting layer 15, and the second electrode 12 are formed by an in-situ vacuum vapor deposition process.

Figure 3:
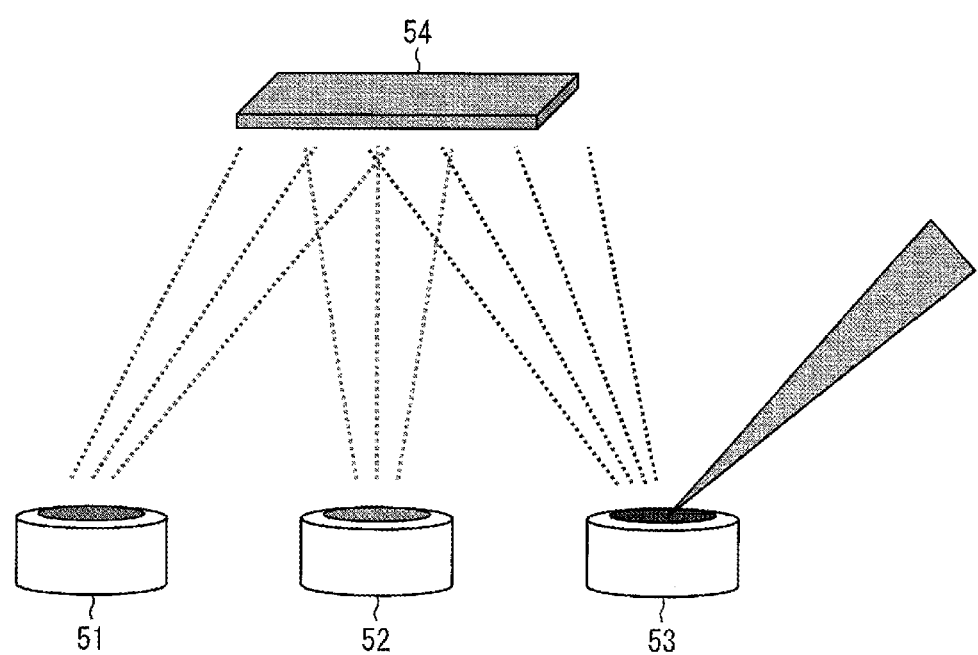
FIG. 3 is a schematic diagram illustrating a process for forming a light-emitting layer of an EL element.

FIG. 3 is a schematic diagram illustrating a process for forming the light-emitting layer of the EL element of the present embodiment.

As illustrated in FIG. 3, in a step of forming the blue-light-emitting layer 15 by vapor deposition, the blue fluorescent material 21, the red phosphorescent material 22, and the ionic liquid 20 are codeposited onto a film formed substrate 54 in a vacuum, from a vapor deposition source 51, for the blue fluorescent material 21, a vapor deposition source 52, for the red phosphorescent material 22, and a vapor deposition source 53, for the ionic liquid 20.

By forming the blue-light-emitting layer 15 by codepositing the blue fluorescent material 21, the red phosphorescent material 22, and the ionic liquid 20 as described above, the blue fluorescent material 21 and the red phosphorescent material 22 can be homogeneously dispersed in the liquid film of the ionic liquid 20.

Additionally, since the blue-light-emitting layer 15 including the ionic liquid 20 is formed by a vapor deposition process in a vacuum, all the layers that form the EL element 10 can be formed by an in-situ vacuum vapor deposition process. Thus, it is unnecessary to increase the number of processes, in contrast with known EL elements, in which the ionic liquid 20 is not used for the blue-light-emitting layer 15.

Note that it is preferable that the ionic liquid 20 be formed by a molecular beam epitaxy method (MBE). Examples of conditions for vapor deposition using a molecular beam epitaxy method may be as follows. The vapor deposition source 53 is placed in a vacuum chamber at $3\times10^{-9}$ torr, and as illustrated in FIG. 3, the target (vapor deposition source 53), which contains the ionic liquid and a Si powder mixed therewith, is irradiated with semiconductor lasers (e.g., continuous wave infrared laser that emits light at 808 nm) through a quartz window. The conditions for continuous wave infrared laser irradiation may include a frequency from 2 to 4 Hz and a pulse width from 10 to 30 ms.

By the vapor deposition method, the amount of vapor deposition of the ionic liquid during laser irradiation can be controlled on the nanometer scale without decomposing the ionic liquid. Additionally, a seed layer may be laid on the substrate and the ionic liquid may be formed thereon by MBE. This enhances the wettability of the ionic liquid, and thus a thin film (liquid film) can be produced. Additionally, by vapor-depositing the ionic liquid on a seed layer, a liquid film in which the ionic liquid is spread can be obtained. Thus, in the case that the ionic liquid 20 is used to form the blue-light-emitting layer 15 by layering multilayer films, the ionic liquid 20 spreads in the form of a liquid film, not in the form of droplets. The film thickness of the ionic liquid 20 can be controlled on the nanometer scale by using a laser microscope or an atomic force microscope together with a QCM.

Other Matters

Note that, in the description of the present embodiment, an example in which, for the EL element 10, the ionic liquid 20 is made from [Bmim][TFSA] has been described, but the ionic liquid 20 may be made from a material other than [Bmim][TFSA].

For example, the ionic liquid 20 may be made from 1-butyl-3-methylimidazolium bis(trifluoromethylsulfonyl)imide, 1-ethyl-3-methylimidazolium bis(trifluoromethylsulfonyl)imide, 1-propyl-3-methylimidazolium bis(trifluoromethylsulfonyl)imide, 1,2-dimethyl-3-propylimidazolium bis(trifluoromethylsulfonyl)methide, N,N-diethyl-N-methyl-N-(2-methoxyethyl)ammonium bis(trifluoromethylsulfonyl)methide, 1-hexyl-3-methylimidazolium bis(trifluoromethylsulfonyl)imide, 1-octyl-3-methylimidazolium bis(trifluoromethylsulfonyl)imide, 1-ethyl-2,3-dimethylimidazolium bis(trifluoromethylsulfonyl)imide, 1-butyl-2,3-dimethylimidazolium bis(trifluoromethylsulfonyl)imide, or the like.

Additionally, it is preferable that the ionic liquid 20 be a hydrophobic ionic liquid. This suppresses moisture from penetrating into the blue-light-emitting layer 15. Additionally, this suppresses the physical properties of the ionic liquid 20 itself from changing as a result of moisture penetration.

Additionally, it is preferable that the ionic liquid 20 be a liquid that produces a cation-π interaction between the blue fluorescent material 21 and the red phosphorescent material 22. This produces an energy-stabilizing interaction between cations in the ionic liquid 20 and π electrons of the blue fluorescent material 21 and the red phosphorescent material 22, which enhances stability for the dissolution and dispersion of the blue fluorescent material 21 and the red phosphorescent material 22 in the ionic liquid 20.

Additionally, by using a green fluorescent material instead of the blue fluorescent material 21, the EL light-emitting device 100 can be configured as a light-emitting device that emits green light, or, by using a red fluorescent material instead of the blue fluorescent material 21, the EL light-emitting device 100 can be configured as a light-emitting device that emits red light.

Additionally, it is preferable that the distance between a reflective electrode 2 and the second electrode 12 be set to a distance that forms an optical path length that is in accordance with the fluorescence wavelength of the blue fluorescent material 21. The reflective electrode 2 is provided to a surface of the first electrode 11, the surface being opposite to the blue-light-emitting layer 15. Thus, a microcavity structure can be provided, and consequently the purity of the color of the emitted light is increased.

Second Embodiment

In the following, another embodiment of the disclosure will be described with reference to FIG. 4. Note that members having the same function as the members stated in the embodiment above are appended with the same reference signs for the sake of description, and the description thereof is omitted.

Figure 4:
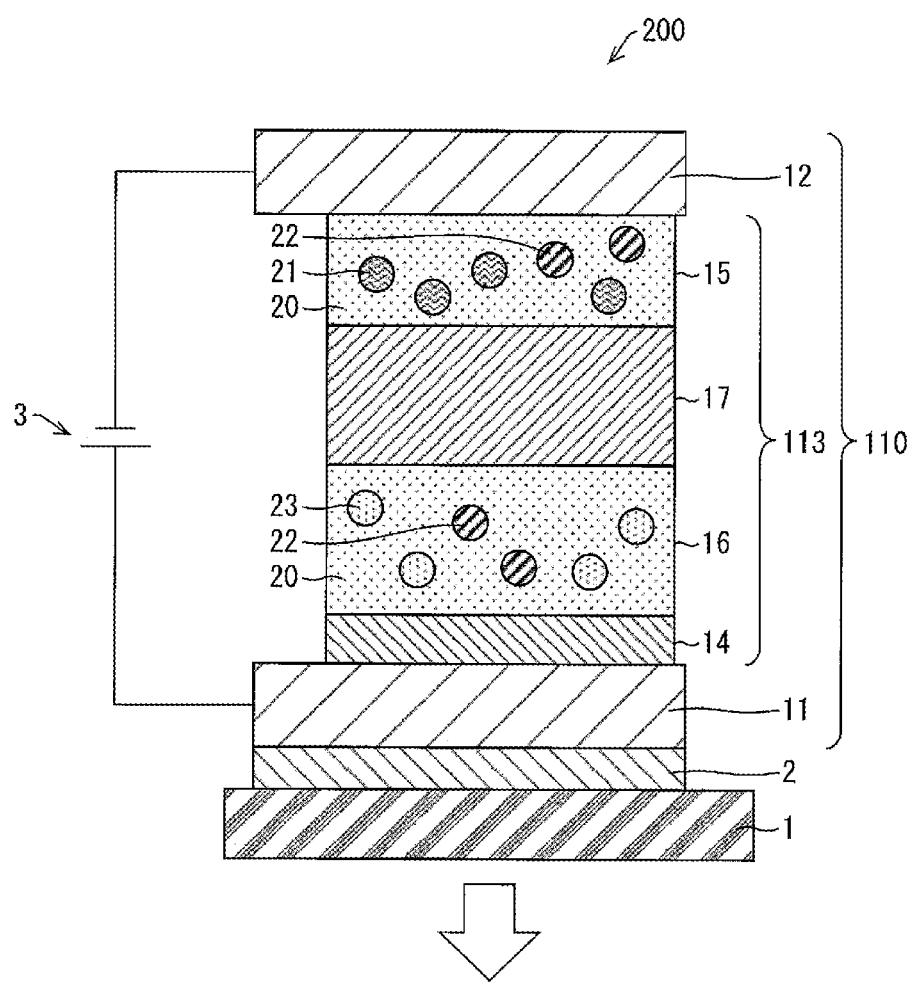
FIG. 4 is a cross-sectional view of an EL light-emitting device according to a second embodiment of the disclosure.

FIG. 4 is a cross-sectional view of an EL light-emitting device according to the present embodiment.

An EL light-emitting device 200, according to the present embodiment, has the same configuration as the EL light-emitting device 100 according to the first embodiment except that an EL layer 113 is included instead of the EL layer 13 of the EL light-emitting device 100 of the first embodiment. The EL layer 113 includes a film thickness adjustment layer 17 (partition layer) and a green-light-emitting layer 16.

The EL layer 113 of the EL light-emitting device 200 has a configuration in which the hole injection layer 14, the green-light-emitting layer 16 (second light-emitting layer), the film thickness adjustment layer 17, and the blue-light-emitting layer 15 (first light-emitting layer) are provided in this order from the first electrode 11-side. Note that, in the present embodiment, the thickness of the blue-light-emitting layer 15 and the green-light-emitting layer 16 may be, for example, 20 nm.

As illustrated in FIG. 4, the green-light-emitting layer 16 includes the ionic liquid 20, a green fluorescent material 23 (fluorescent material, second fluorescent material), and the red phosphorescent material 22. The green fluorescent material 23 and the red phosphorescent material 22 are homogeneously dispersed in the liquid film of the ionic liquid 20.

The lowest triplet excited state energy level of the red phosphorescent material 22 is higher than the lowest triplet excited state energy level of the green fluorescent material 23. Additionally, the lowest singlet excited state energy level of the green fluorescent material 23 is higher than the lowest singlet excited state energy level of the red phosphorescent material 22.

Thus, the red phosphorescent material 22 serves as a photosensitizer for the green fluorescent material 23, and consequently, green light, which corresponds to the fluorescence wavelength region of the green fluorescent material 23, is extracted from the green-light-emitting layer 16. That is, in the green-light-emitting layer 16 of the present embodiment, the red phosphorescent material 22 is a donor and the green fluorescent material 23 is an acceptor. The green fluorescent material 23 may be made from, for example, 9,10-bis(phenylethynyl)anthracene (BPEA).

Blue light is extracted from the blue-light-emitting layer 15, green light is extracted from the green-light-emitting layer 16, and white light, which is light of mixed colors, is extracted from an entire EL element 110. That is, the EL light-emitting device 200 of the present embodiment is a light-emitting device that emits white light.

The film thickness adjustment layer 17 suppresses energy exchange due to Forster transfer between the blue fluorescent material 21 and red phosphorescent material 22 included in the blue-light-emitting layer 15 and the green fluorescent material 23 and red phosphorescent material 22 included in the green-light-emitting layer 16. As a result, TTA is induced efficiently to achieve upconversion light emission. Additionally, the film thickness adjustment layer 17, provided between the blue-light-emitting layer 15 and the green-light-emitting layer 16, enables extraction of blue light from the blue-light-emitting layer 15 and extraction of green light from the green-light-emitting layer 16. Note that it is preferable that the thickness of the film thickness adjustment layer 17 be from 20 nm to 40 nm.

Mixing Ratio between Fluorescent Material and Phosphorescent Material

It is preferable that the mixing contents of the fluorescent material and the phosphorescent material in the blue-light-emitting layer 15 and in the green-light-emitting layer 16 be appropriately set to efficiently induce TTA to achieve upconversion light emission.

More specifically, it is preferable that, in the blue-light-emitting layer 15, the intermolecular distance of the blue fluorescent material 21 be small, preferably within a Dexter effective radius, in order to ensure that migration occurs between the blue fluorescent material 21B in the triplet excited state and other portions of the blue fluorescent material 21. Likewise, it is preferable that, in the green-light-emitting layer 16, the intermolecular distance of a green fluorescent material 23 be small, preferably within a Dexter effective radius, in order to ensure that migration occurs between a green fluorescent material 23B, which is in a triplet excited state, and other portions of the green fluorescent material 23.

For example, it is preferable that, in the blue-light-emitting layer 15, the intermolecular distance of the blue fluorescent material 21 be from 0 nm to 1 nm. Likewise, it is preferable that, in the green-light-emitting layer 16, the intermolecular distance of the green fluorescent material 23 be from 0 nm to 1 nm. With this, migration of excitons is efficiently caused in the fluorescent materials, and consequently, upconversion light emission involving TTA is efficiently produced.

Additionally, it is preferable that, in the blue-light-emitting layer 15 and the green-light-emitting layer 16, the intermolecular distance of the red phosphorescent material 22 be large in order to suppress Forster transfer between molecules of the red phosphorescent material 22. For example, it is preferable that the intermolecular distance of the red phosphorescent material 22 be greater than 10 nm and 40 nm or less. Additionally, it is more preferable that the intermolecular distance be 20 nm or greater. As a result, energy transfer efficiency of the red phosphorescent material 22 is from 0% to 50%, and thus Forster transfer between molecules of the red phosphorescent material 22 is suppressed. Thus, emission of red light in the blue-light-emitting layer 15 and the green-light-emitting layer 16 is suppressed. Particularly, for light-emitting devices that emit monochromatic light, such as the EL light-emitting device 100 of the first embodiment, it is preferable that the intermolecular distance of the red phosphorescent material 22 be large.

Third Embodiment

In the following, another embodiment of the disclosure will be described with reference to FIG. 5. Note that members having the same function as the members stated in the embodiment above are appended with the same reference signs for the sake of description, and the description thereof is omitted.

FIG. 5 is a cross-sectional view of an EL light-emitting device according to the present embodiment.

An EL light-emitting device 300, according to the present embodiment, includes an EL element 210. The EL light-emitting device 300 has the same configuration as the EL light-emitting device 100 according to the first embodiment except that the EL element 210 includes, instead of the second electrode 12 of the EL light-emitting device 100 of the first embodiment, a second electrode 212, which is transparent or semitransparent.

When a voltage is applied between the first electrode 11 and the second electrode 212, positive holes are injected into the EL layer 13 from the first electrode 11, and electrons are injected into the EL layer 13 from the second electrode 212. When the positive holes and electrons combine with each other in the blue-light-emitting layer 15, the blue-light-emitting layer 15 emits light. The light produced in the blue-light-emitting layer 15 is extracted from the second electrode 212-side. That is, the EL light-emitting device 300 is a top-emitting type light-emitting device.

Note that, although not illustrated, the EL light-emitting device 200 of the second embodiment may also be formed as a top-emitting type white-light light-emitting device by forming the second electrode 12 as a transparent or semitransparent electrode.

Additionally, it is preferable that the distance between the reflective electrode 2 and the second electrode 212 be set to a distance that forms an optical path length that is in accordance with the fluorescence wavelength of the blue fluorescent material 21. Thus, a microcavity structure can be provided, and consequently, the purity of the color of the emitted light is increased.

Fourth Embodiment

In the following, another embodiment of the disclosure will be described with reference to FIGS. 6A and 6B. Note that members having the same function as the members stated in the embodiment above are appended with the same reference signs for the sake of description, and the description thereof is omitted.

FIGS. 6A and 6B illustrate a configuration of an EL light-emitting device according to the present embodiment. FIG. 6A is a plan view and FIG. 6B is a cross-sectional view along line A-A' of FIG. 6A, viewed in the direction of the arrow.

An EL light-emitting device 400, according to the present embodiment, has the same configuration as the EL light-emitting device 100 according to the first embodiment except that a plurality of light-emitting regions including respective EL layers that emit light of different respective colors are included.

As illustrated in FIG. 6A, the EL light-emitting device 400 includes a red-light-emitting region 400R, a green-light-emitting region 400G, and a blue-light-emitting region 400B. The red-light-emitting region 400R emits red light. The green-light-emitting region 400G emits green light. The blue-light-emitting region 400B emits blue light. In a plan view, the red-light-emitting region 400R, the green-light-emitting region 400G, and the blue-light-emitting region 400B are arranged in a row.

As illustrated in FIG. 6B, over the substrate 1, a red-light-emitting EL layer 13R is provided in the red-light-emitting region 400R over the substrate 1, a green-light-emitting EL layer 13G is provided in the green-light-emitting region 400G, and a blue-light-emitting EL layer 13B is provided in the blue-light-emitting region 400B. Note that the EL light-emitting device 400 includes the components described above with reference to FIG. 1, such as the reflective electrode, the hole injection layer, and the first and second electrodes, but illustration of these components is omitted in FIG. 6B, for description.

The EL layer 13, described above in the first embodiment, may be used as the blue-light-emitting EL layer 13B. A layer that can be obtained by replacing the blue fluorescent material 21 of the EL layer 13 described above in the first embodiment with a red fluorescent material may be used as the red-light-emitting EL layer 13R. A layer that can be obtained by replacing the blue fluorescent material 21 of the EL layer 13 described above in the first embodiment with a green fluorescent material may be used as the green-light-emitting EL layer 13G.

A sealing layer 65 is provided over each of the EL layers. Additionally, a bank 60 is provided between adjacent light-emitting layers. The bank 60 divides the light-emitting layers from one another. The bank 60 may be made of, for example, a polyimide film.

Additionally, as illustrated in FIG. 6B, it is preferable that the distance between the second electrode, provided for each of the light-emitting regions, and a reflective electrode (not illustrated) be set to a distance that forms an optical path length that is in accordance with the fluorescence wavelength of the fluorescent material included in each of the light-emitting layers. Thus, a microcavity structure can be provided, and consequently, the purity of the color of the emitted light is increased.

The amount of emission light of each of the light-emitting regions can be individually controlled, and thus the EL light-emitting device 400 is able to emit light of various colors. Hence, the EL light-emitting device 400 may be utilized as, for example, a full-color display device.

Fifth Embodiment

In the following, another embodiment of the disclosure will be described with reference to FIGS. 7A and 7B. Note that members having the same function as the members stated in the embodiment above are appended with the same reference signs for the sake of description, and the description thereof is omitted.

Figure 7A:
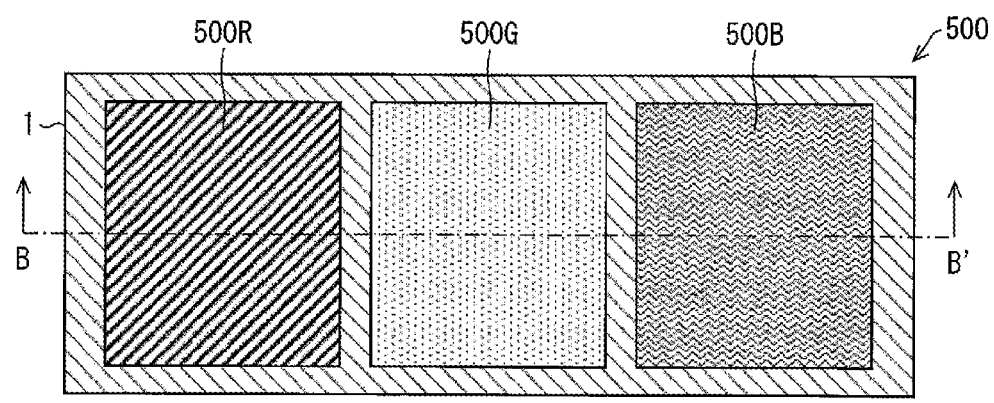
FIGS. 7A and 7B illustrate a configuration of an EL light-emitting device according to a fifth embodiment of the disclosure.
Figure 7B:
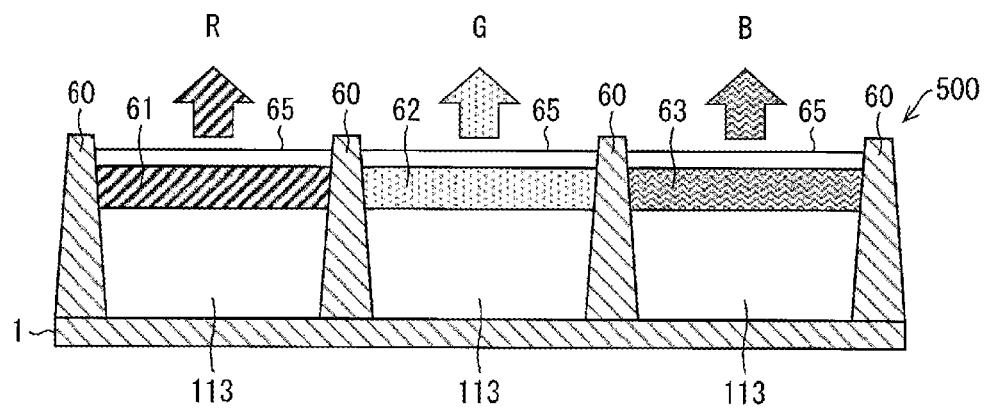

FIGS. 7A and 7B illustrate a configuration of an EL light-emitting device according to the present embodiment. FIG. 7A is a plan view and FIG. 7B is a cross-sectional view along line B-B' of FIG. 7A, viewed in the direction of the arrow.

An EL light-emitting device 500, according to the present embodiment, has the same configuration as the EL light-emitting device 400 according to the fourth embodiment except that an EL layer that emits white light and a color filter are provided for each of the light-emitting regions.

As illustrated in FIG. 7A, the EL light-emitting device 500 includes a red-light-emitting region 500R, a green-light-emitting region 500G, and a blue-light-emitting region 500B. The red-light-emitting region 500R emits red light. The green-light-emitting region 500G emits green light. The blue-light-emitting region 500B emits blue light. In a plan view, the red-light-emitting region 500R, the green-light-emitting region 500G, and the blue-light-emitting region 500B are arranged in a row.

As illustrated in FIG. 7B, white-light-emitting EL layers 113 are provided for the red-light-emitting region 500R, the green-light-emitting region 500G, and the blue-light-emitting region 500B, over the substrate 1. Note that the EL light-emitting device 500 includes the components described above with reference to FIG. 1, such as the reflective electrode, the hole injection layer, and the first and second electrodes, but illustration of these components is omitted in FIG. 7B, for description. The EL layer 113, described above in the second embodiment, may be used as the white-light-emitting EL layer 113.

Further, as illustrated in FIG. 7B, a color filter 61 is provided between the white-light-emitting EL layer 113 and the sealing layer 65 in the red-light-emitting region 500R, a color filter 62 is provided between the white-light-emitting EL layer 113 and the sealing layer 65 in the green-light-emitting region 500G, and a color filter 63 is provided between the white-light-emitting EL layer 113 and the sealing layer 65 in the blue-light-emitting region 500B. The color filter 61 transmits red light, the color filter 62 transmits green light, and the color filter 63 transmits blue light. Thus, light of different colors can be extracted from the respective light-emitting regions.

The amount of emission light of each of the light-emitting regions can be individually controlled, and thus the EL light-emitting device 500 is able to emit light of various colors. Hence, the EL light-emitting device 500 may be utilized as, for example, a full-color display device.

Supplement

An EL element according to a first aspect of the disclosure is an EL element (10, 110, 210) including a first electrode (11), a second electrode (12, 212), and at least one light-emitting layer (blue-light-emitting layer 15, green-light-emitting layer 16) provided between the first electrode and the second electrode. The light-emitting layer includes an ionic liquid (20), a phosphorescent material (red phosphorescent material 22), and a fluorescent material (blue fluorescent material 21, green fluorescent material 23). A lowest triplet excited state energy level of the phosphorescent material is higher than a lowest triplet excited state energy level of the fluorescent material, and a lowest singlet excited state energy level of the fluorescent material is higher than a lowest singlet excited state energy level of the phosphorescent material. The fluorescent material and the phosphorescent material are homogeneously dispersed in a liquid film of the ionic liquid.

The configuration described above facilitates the occurrence of diffusion and collision of molecules that form the fluorescent material and the phosphorescent material, compared with the case in which the fluorescent material and the phosphorescent material are included in a solid. Thus, the EL element utilizing upconversion light emission involving highly efficient triplet-triplet annihilation is provided.

An EL element according to a second aspect of the disclosure may be configured as follows. In the first aspect, a fluorescence wavelength of the fluorescent material may be in an ultraviolet range or a blue wavelength range.

The configuration described above enables emission of upconverted high-energy light.

An EL element according to a third aspect of the disclosure may be configured as follows. In the first or second aspect, a reflective electrode (2) may be provided to a surface of the first electrode, the surface being opposite to the light-emitting layer, the first electrode may be a transparent electrode or a semitransparent electrode, and a distance between the reflective electrode and the second electrode may be a distance forming an optical path length that is in accordance with the fluorescence wavelength of the fluorescent material.

The configuration described above provides a microcavity structure and thus enables light having high color purity to be extracted from the first electrode-side.

An EL element according to a fourth aspect of the disclosure may be configured as follows. In the first or second aspect, a reflective electrode may be provided to a surface of the first electrode, the surface being opposite to the light-emitting layer, the second electrode may be a transparent electrode or a semitransparent electrode, and a distance between the reflective electrode and the second electrode may be a distance forming an optical path length that is in accordance with the fluorescence wavelength of the fluorescent material.

The configuration described above provides a microcavity structure and thus enables light having high color purity to be extracted from the second electrode-side.

An EL element according to a fifth aspect of the disclosure may be configured as follows. In the first aspect, the light-emitting layer may include a first light-emitting layer (blue-light-emitting layer 15) and a second light-emitting layer (green-light-emitting layer 16), the first light-emitting layer and the second light-emitting layer being layered between the first electrode and the second electrode, the first light-emitting layer may include the phosphorescent material and a first fluorescent material (blue fluorescent material 21), and the second light-emitting layer may include the phosphorescent material and a second fluorescent material (green fluorescent material 23) having a fluorescence wavelength different from a fluorescence wavelength of the first fluorescent material.

The configuration described above enables light of mixed colors, including the fluorescent color of the first fluorescent material and the fluorescent color of the second fluorescent material, to be extracted from the light-emitting layer. Thus, white light can be emitted, for example.

An EL element according to a sixth aspect of the disclosure may be configured as follows. In the fifth aspect, a partition layer (film thickness adjustment layer 17) may be provided between the first light-emitting layer and the second light-emitting layer, the partition layer being configured to suppress energy exchange between a material included in the first light-emitting layer and a material included in the second light-emitting layer.

The configuration described above suppresses energy exchange due to Forster transfer between the fluorescent material and phosphorescent material included in the first light-emitting layer and the fluorescent material and phosphorescent material included in the second light-emitting layer. As a result, TTA is induced efficiently to achieve upconversion light emission. Additionally, fluorescent light of the first fluorescent material can be extracted from the first light-emitting layer, and fluorescent light of the second fluorescent material can be extracted from the second light-emitting layer.

An EL element according to a seventh aspect of the disclosure may be configured as follows. In any one of the first to sixth aspects, an intermolecular distance of the fluorescent material in the light-emitting layer may be from 0 nm to 1 nm.

The configuration described above enables migration between portions in the triplet excited state of the fluorescent material and other portions of the fluorescent material to occur and thus efficiently produces upconversion light emission involving TTA.

An EL element according to an eighth aspect of the disclosure may be configured as follows. In any one of the first to seventh aspects, an intermolecular distance of the phosphorescent material in the light-emitting layer may be greater than 10 nm and 40 nm or less. More preferably, in the configuration, the intermolecular distance may be from 20 nm to 40 nm.

The configuration described above provides energy transfer efficiency in the phosphorescent material from 0% to 50% and thus suppresses Forster transfer between molecules of the phosphorescent material, and consequently suppresses phosphorescent light of the phosphorescent material in the light-emitting layer.

An EL element according to a ninth aspect of the disclosure may be configured as follows. In any one of the first to eighth aspects, the ionic liquid may be hydrophobic. The configuration described above suppresses penetration of moisture into the fluorescent material and the phosphorescent material. Additionally, a change of the physical properties of the ionic liquid itself that is caused by moisture penetration is suppressed.

An EL element according to a tenth aspect of the disclosure may be configured as follows. In any one of the first to ninth aspects, the ionic liquid may be configured to produce a cation-π interaction between the fluorescent material and the phosphorescent material.

The configuration described above produces an energy-stabilizing interaction between cations in the ionic liquid and π electrons of the fluorescent material and the phosphorescent material, which enhances stability for the dissolution and dispersion of the fluorescent material and the phosphorescent material in the ionic liquid.

An EL element according to an eleventh aspect of the disclosure may be configured as follows. In any one of the first to tenth aspects, the ionic liquid may have a viscosity at 300K from 0.000001 Pa·S to 1 Pa·S.

The configuration described above enables, at normal temperatures, the fluorescent material and the phosphorescent material to be homogeneously dispersed in the liquid film of the ionic liquid.

An EL element according to a twelfth aspect of the disclosure may be configured as follows. In any one of the first to eleventh aspects, a melting point and a freezing point of the ionic liquid may each be from −200° C. to 0° C.

The configuration described above enables, at normal temperatures, the ionic liquid to be liquid and the fluorescent material and the phosphorescent material to be homogeneously dispersed in the liquid film of the ionic liquid.

A method for manufacturing an EL element, according to a thirteenth aspect of the disclosure is as follows. The EL element includes a first electrode, a second electrode, and at least one light-emitting layer provided between the first electrode and the second electrode. The light-emitting layer includes a phosphorescent material and a fluorescent material. A lowest triplet excited state energy level of the phosphorescent material is higher than a lowest triplet excited state energy level of the fluorescent material, and a lowest singlet excited state energy level of the fluorescent material is higher than a lowest singlet excited state energy level of the phosphorescent material. The method includes forming the light-emitting layer by codepositing an ionic liquid, the phosphorescent material, and the fluorescent material.

The manufacturing method described above involves codeposition of the ionic liquid, the phosphorescent material, and the fluorescent material and thus enables the fluorescent material and the phosphorescent material to be homogeneously dispersed in the liquid film of the ionic liquid. Thus, the EL element, in which upconversion light emission involving highly efficient triplet-triplet annihilation is made possible, is manufactured.

A method for manufacturing an EL element, according to a fourteenth aspect of the disclosure may be as follows. In the thirteenth aspect, the ionic liquid, the phosphorescent material, and the fluorescent material may be codeposited in a vacuum.

The manufacturing method described above enables the EL element to be manufactured by performing an in-situ vacuum vapor deposition process, in which the other layers that form the EL element are also vapor-deposited.

The disclosure is not limited to each of the embodiments stated above, and various modifications may be implemented within a range not departing from the scope of the claims. Embodiments obtained by appropriately combining technical approaches stated in each of the different embodiments also fall within the scope of the technology of the disclosure. Moreover, novel technical features may be formed by combining the technical approaches stated in each of the embodiments.

REFERENCE SIGNS LIST

2 Reflective electrode
10, 110, 210 EL element
11 First electrode
12, 212 Second electrode
15 Blue-light-emitting layer (light-emitting layer, first light-emitting layer)
16 Green-light-emitting layer (light-emitting layer, second light-emitting layer)
17 Film thickness adjustment layer (partition layer)
20 Ionic liquid
21 Blue fluorescent material (fluorescent material)
22 Red phosphorescent material (phosphorescent material)
23 Green fluorescent material (fluorescent material)
100, 200, 300, 400, 500 EL light-emitting device

The invention claimed is:

1. An EL element comprising:
a red-light-emitting region, a green-light-emitting region, and a blue-light-emitting region;
a first electrode and a second electrode that are in each of the red-light-emitting region, the green-light-emitting region, and the blue-light-emitting region;
EL layers provided between the first electrode and the second electrode in each of the red-light-emitting region, the green-light-emitting region, and the blue-light-emitting region;
a light-emitting layer included in each of the EL layers; and
a bank including portions provided between adjacent pairs of the light-emitting layers, wherein
the EL layers include a red-light-emitting EL layer, a green-light-emitting EL layer, and a blue-light-emitting EL layer,
distances between an upper surface of the red-light-emitting EL layer and an upper surface of the bank, between an upper surface of the green-light-emitting EL layer and the upper surface of the bank, and between an upper surface of the blue-light-emitting EL layer and the upper surface of the bank are respectively arranged in descending order of length,
each of the light-emitting layers includes an ionic liquid, a phosphorescent material, and a fluorescent material,
a lowest triplet excited state energy level of the phosphorescent material is higher than a lowest triplet excited state energy level of the fluorescent material, and a lowest singlet excited state energy level of the fluorescent material is higher than a lowest singlet excited state energy level of the phosphorescent material, and
the fluorescent material and the phosphorescent material are homogeneously dispersed in a liquid film of the ionic liquid.

2. The EL element according to claim 1, wherein a fluorescence wavelength of the fluorescent material is in an ultraviolet range or a blue wavelength range.

3. The EL element according to claim 1, wherein
a reflective electrode is provided to a surface of the first electrode, the surface being opposite to the light-emitting layer,
the first electrode is a transparent electrode or a semi-transparent electrode, and
a distance between the reflective electrode and the second electrode is a distance forming an optical path length that is in accordance with a fluorescence wavelength of the fluorescent material.

4. The EL element according to claim 1, wherein
a reflective electrode is provided to a surface of the first electrode, the surface being opposite to the light-emitting layer,
the second electrode is a transparent electrode or a semi-transparent electrode, and
a distance between the reflective electrode and the second electrode is a distance forming an optical path length that is in accordance with a fluorescence wavelength of the fluorescent material.

5. The EL element according to claim 1, wherein
each of the light-emitting layers includes a first light-emitting layer and a second light-emitting layer, the first light-emitting layer and the second light-emitting layer being layered between the first electrode and the second electrode,
the first light-emitting layer includes the phosphorescent material and a first fluorescent material, and
the second light-emitting layer includes the phosphorescent material and a second fluorescent material having a fluorescence wavelength different from a fluorescence wavelength of the first fluorescent material.

6. The EL element according to claim 5, wherein a partition layer is provided between the first light-emitting layer and the second light-emitting layer, the partition layer being configured to suppress energy exchange between a material included in the first light-emitting layer and a material included in the second light-emitting layer.

7. The EL element according to claim 1, wherein an intermolecular distance of the fluorescent material in the light-emitting layer is from 0 nm to 1 nm.

8. The EL element according to claim 1, wherein an intermolecular distance of the phosphorescent material in the light-emitting layer is greater than 10 nm and 40 nm or less.

9. The EL element according to claim 1, wherein the ionic liquid is hydrophobic.

10. The EL element according to claim 1, wherein the ionic liquid is configured to produce a cation-n interaction between the fluorescent material and the phosphorescent material.

11. The EL element according to claim 1, wherein the ionic liquid has a viscosity at 300K from 0.000001 PaS to 1 PaS.

12. The EL element according to claim 1, wherein a melting point and a freezing point of the ionic liquid are each from −200° C. to 0° C.

13. A method for manufacturing an EL element, the EL element including:
- a red-light-emitting region, a green-light-emitting region, and a blue-light-emitting region;
- a first electrode and a second electrode that are in each of the red-light-emitting region, the green-light-emitting region, and the blue-light-emitting region;
- EL layers provided between the first electrode and the second electrode in each of the red-light-emitting region, the green-light-emitting region, and the blue-light-emitting region; and
- a light-emitting layer included in each of the EL layers, the EL layers including a red-light-emitting EL layer, a green-light-emitting EL layer, and a blue-light-emitting EL layer, wherein each of the light-emitting layers includes a phosphorescent material and a fluorescent material, a lowest triplet excited state energy level of the phosphorescent material is higher than a lowest triplet excited state energy level of the fluorescent material, and a lowest singlet excited state energy level of the fluorescent material is higher than a lowest singlet excited state energy level of the phosphorescent material, the method comprising:
- forming a bank to define each of the red-light-emitting region, the green-light-emitting region, and the blue-light-emitting region; and
- forming each of the light-emitting layers by codepositing an ionic liquid, the phosphorescent material, and the fluorescent material into respective ones of the red-light-emitting region, the green-light-emitting region, and the blue-light-emitting region, wherein
- distances between an upper surface of the red-light-emitting EL layer and an upper surface of the bank, between an upper surface of the green-light-emitting EL layer and the upper surface of the bank, and between an upper surface of the blue-light-emitting EL layer and the upper surface of the bank are respectively arranged in descending order of length.

14. The method for manufacturing an EL element, according to claim 13, wherein the ionic liquid, the phosphorescent material, and the fluorescent material are codeposited in a vacuum.

* * * * *